(12) United States Patent
Barthel et al.

(10) Patent No.: US 12,155,023 B2
(45) Date of Patent: Nov. 26, 2024

(54) OPTOELECTRONIC SEMICONDUCTOR CHIP

(71) Applicant: OSRAM Opto Semiconductors GmbH, Regensburg (DE)

(72) Inventors: Stefan Barthel, Regensburg (DE); Anna Nirschl, Regenstauf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 405 days.

(21) Appl. No.: 17/612,333

(22) PCT Filed: May 14, 2020

(86) PCT No.: PCT/EP2020/063474
§ 371 (c)(1),
(2) Date: Nov. 18, 2021

(87) PCT Pub. No.: WO2020/234112
PCT Pub. Date: Nov. 26, 2020

(65) Prior Publication Data
US 2022/0320398 A1 Oct. 6, 2022

(30) Foreign Application Priority Data
May 20, 2019 (DE) ............. 10 2019 113 315.7

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01)

(58) Field of Classification Search
CPC ................ H01L 33/36; H01L 33/38; H01L 33/382–387; H01L 2933/0016;
(Continued)

(56) References Cited

U.S. PATENT DOCUMENTS 8,823,043 B2 * 9/2014 Tu ..................... H01L 33/42
257/79
2008/0246047 A1 10/2008 Hsu et al.
(Continued)

FOREIGN PATENT DOCUMENTS

CN 202855792 U 4/2013
DE 10147887 A1 4/2003
(Continued)

OTHER PUBLICATIONS

International Search Report (with English Translation) and Written Opinion in corresponding International Application No. PCT/EP2020/063474 mailed on Jul. 3, 2020, 13 pages.
(Continued)

*Primary Examiner* — Sonya McCall-Shepard
(74) *Attorney, Agent, or Firm* — MH2 Technology Law Group LLP (57) ABSTRACT

The invention relates to an optoelectronic semiconductor chip comprising a semiconductor layer sequence with a first semiconductor layer, a second semiconductor layer and an active layer between the first and the second semiconductor layers. The optoelectronic semiconductor chip further comprises a first contact structure with a plurality of first contact pins and a first contact layer for electrically contacting the first semiconductor layer and a second contact structure for electrically contacting the second semiconductor layer. The first semiconductor layer is disposed between the first contact layer and the active layer. The first contact pins are disposed between the first contact layer and the first semi-
(Continued)

conductor layer and are separated and spaced at a distance from one another in the lateral direction. An electrical connection with an electrical resistance between the first contact layer and the first semiconductor layer is formed by each first contact pin. The first contact pins are selected such that they have different electrical resistances as a result of electrical connections formed by two different first contact pins.

15 Claims, 6 Drawing Sheets

(51) Int. Cl.
*H01L 33/38* (2010.01)
*H01L 33/42* (2010.01)

(58) Field of Classification Search
CPC ............ H01L 2933/0066; H01L 33/40; H01L 33/405; H01L 33/42; H01L 33/46; H01L 33/60; H01L 33/62; H01L 25/0753; H01L 33/385; H10K 50/814
See application file for complete search history.

(56) References Cited

U.S. PATENT DOCUMENTS

| | | |
|---|---|---|
| 2012/0049154 A1* | 3/2012 | Schubert ............ H01L 33/387 257/76 |
| 2012/0049756 A1 | 3/2012 | Schubert |
| 2013/0105844 A1 | 5/2013 | Tu |
| 2014/0048904 A1 | 2/2014 | Zundel et al. |
| 2015/0236209 A1 | 8/2015 | Pfeuffer |

FOREIGN PATENT DOCUMENTS

| | | |
|---|---|---|
| DE | 102011111919 A1 | 2/2013 |
| DE | 102012108883 A1 | 3/2014 |
| EP | 3306680 A1 | 4/2018 |
| KR | 20020018940 A | 3/2002 |

OTHER PUBLICATIONS

Chinese Office Action issued in corresponding Chinese Patent Application No. 202080037864.4, with English language translation, dated Jul. 1, 2024, 15 pages.

Chinese Office Action issued in corresponding Chinese Patent Application No. 202080037864.4 dated Sep. 10, 2024, with English language translation, 13 pages.

* cited by examiner

OPTOELECTRONIC SEMICONDUCTOR CHIP

CROSS-REFERENCE TO RELATED APPLICATIONS

This patent application is a national stage entry from International Application No. PCT/EP2020/063474, filed on May 14, 2020, published as International Publication No. WO 2020/234112 A1 on Nov. 26, 2020, and claims priority under 35 U.S.C. § 119 from German patent application 10 2019 113 315.7, filed May 20, 2019, the entire contents of all of which are incorporated by reference herein.

FIELD

An optoelectronic semiconductor chip is specified.

BACKGROUND

One object that is to be achieved consists, inter alia, in specifying an optoelectronic semiconductor chip which is distinguished by a particularly homogeneous current density distribution, luminance distribution and temperature distribution.

This object is achieved by means of a substantive article having the features of the independent patent claim. The dependent patent claims relate to advantageous configurations and developments.

SUMMARY

In accordance with at least one embodiment of the optoelectronic semiconductor chip, the latter comprises a semiconductor layer sequence having a first semiconductor layer, a second semiconductor layer and an active layer arranged between the first and the second semiconductor layers. The semiconductor layer sequence is based for example on a III-V compound semiconductor material. The semiconductor material is for example a nitride compound semiconductor material, such as for example $Al_nIn_{1-n-m}Ga_mN$, or a phosphide compound semiconductor material, such as $Al_nIn_{1-n-m}Ga_mP$ or an arsenide compound semiconductor material, such as $Al_nIn_{1-n-m}Ga_mAs$ or $Al_nIn_{1-n-m}AsP$, wherein in each case $0 \leq n \leq 1$, $0 \leq m \leq 1$ and $m+n \leq 1$. In this case, the semiconductor layer sequence can comprise dopants and additional constituents. For the sake of simplicity, however, only the essential constituents of the crystal lattice of the semiconductor layer sequence, that is to say Al, As, Ga, In, N or P, are specified even if these can be replaced and/or supplemented in part by small amounts of further substances. Preferably, the semiconductor layer sequence is based on InGaAlP.

The active layer serves for generating or for absorbing electromagnetic radiation. The active layer includes in particular at least one pn junction and/or at least one quantum well structure in the form of a single quantum well, SQW for short, or in the form of a multiquantum well structure, MQW for short. Preferably, the semiconductor chip comprises a, in particular exactly one, connected active layer.

By way of example, during operation as intended, the semiconductor chip generates electromagnetic radiation in the blue or green or red spectral range or in the UV range or in the IR range.

By way of example, the first semiconductor layer is formed with a p-conducting material and the second semiconductor layer is formed with an n-conducting material. Alternatively, the first semiconductor layer is formed with an n-conducting material and the second semiconductor layer is formed with a p-conducting material.

Hereinafter, a semiconductor chip is understood to mean a separately handleable and electrically contactable element. A semiconductor chip preferably arises as a result of singulation from a wafer assemblage. In particular, side surfaces of such a semiconductor chip then have for example traces from the process of singulation of the wafer assemblage. A semiconductor chip preferably comprises exactly one originally connected region of the semiconductor layer sequence grown in the wafer assemblage. The semiconductor layer sequence of the semiconductor chip is preferably embodied in connected fashion. A lateral extent of the semiconductor chip, measured parallel to the main plane of extent of the semiconductor layer sequence or of the semiconductor chip, is for example at most 5% or at most 10% greater than the lateral extent of the semiconductor layer sequence.

In accordance with at least one embodiment, the optoelectronic semiconductor chip comprises a first contact structure having a plurality of first contact pins and a first contact layer for electrically contacting the first semiconductor layer. In particular, during operation as intended, the first semiconductor layer is supplied with current by way of the first contact structure. Preferably, the first contact layer comprises a metal, such as gold, silver, aluminum, palladium, platinum, titanium, nickel, an electrically conductive oxide, or consists of one of these materials or a mixture of these materials.

In accordance with at least one embodiment of the optoelectronic semiconductor chip, the latter comprises a second contact structure for electrically contacting the second semiconductor layer. In particular, during operation as intended, the second semiconductor layer is energized by way of the second contact structure. Preferably, the second contact structure comprises a metal, such as gold, silver, aluminum, palladium, platinum, titanium, nickel, an electrically conductive oxide, or consists of one of these materials, or a mixture of these materials. The second contact structure is formed for example from the same material as the first contact layer.

In accordance with at least one embodiment, the first semiconductor layer is arranged between the first contact layer and the active layer. By way of example, the main planes of extent of the first semiconductor layer, of the first contact layer and of the active layer run substantially parallel to one another. In particular, the first semiconductor layer and the active layer have an identical lateral extent within the scope of production tolerance. Here and hereinafter, "lateral extent" of a layer is taken to mean an extent in a plane which runs parallel to the main plane of extent of said layer. In particular, the first semiconductor layer adjoins the active layer and the first contact pins. Preferably, the first semiconductor layer is in direct contact with the active layer and with the first contact pins.

In accordance with at least one embodiment, the first contact pins are arranged between the first semiconductor layer and the first contact layer. By way of example, the first contact layer is not in direct contact with the first semiconductor layer. In particular, the first contact layer is in electrical contact with the first semiconductor layer only by way of the first contact pins.

In accordance with at least one embodiment, the first contact pins are arranged in a manner separated and spaced apart from one another in a lateral direction. Here and hereinafter, "lateral direction" is taken to mean a direction which runs parallel to the main plane of extent of the active layer. In particular, the first contact pins are electrically insulated from one another in a lateral direction. That is to say that two arbitrary first contact pins are electrically conductively connected to one another only by way of the first contact layer and/or the first semiconductor layer. By way of example, the interspace between two arbitrary adjacent first contact pins is filled with an electrically insulating material. The electrically insulating material comprises for example silicon dioxide and/or silicon nitride and/or aluminum oxide or consists thereof. Alternatively, the space between two first contact pins is filled with air or gas. By way of example, the distance between two adjacent first contact pins in a lateral direction is at least 2 µm or at least 4 µm or at least 6 µm or at least 8 µm.

In accordance with at least one embodiment, each first contact pin forms an electrical connection with an electrical resistance between the first contact layer and the first semiconductor layer. By way of example, during operation as intended, the first semiconductor layer is energized by way of the first contact pins. Preferably, charge carriers can be exchanged between the first semiconductor layer and the first contact layer only by way of the first contact pins. In this case, a current experiences an electrical resistance on its path from the first contact layer to the first semiconductor layer through a contact pin.

In accordance with at least one embodiment, the first contact pins are chosen such that electrical connections formed by two different first contact pins have different electrical resistances. "Different electrical resistances" is taken to mean here that the resistances are different in a predefined way, that is to say are not caused solely by production tolerances. For example, the resistance of one electrical connection is at least 1.1 times or at least 1.2 times or at least 1.5 times the magnitude of that of another electrical connection. Preferably, the larger resistance is at most 10 times or at most 5 times the magnitude of the smaller resistance.

By way of example, the first contact pins are chosen such that, apart from an electrical connection formed by a first contact pin, all electrical connections formed by the first contact pins have the same electrical resistance within the scope of production tolerance. The electrical connection formed by the remaining first contact pin has a value for the electrical resistance that is different than the other electrical connections.

Alternatively, the first contact pins are chosen such that each individual electrical connection has an electrical resistance which otherwise no other electrical connection has. In this case, the electrical resistances of the electrical connections formed by the first contact pins are different in pairwise fashion.

In at least one embodiment, the optoelectronic semiconductor chip comprises a semiconductor layer sequence having a first semiconductor layer, a second semiconductor layer and an active layer between the first and the second semiconductor layers. The optoelectronic semiconductor chip comprises a first contact structure having a plurality of first contact pins and a first contact layer for electrically contacting the first semiconductor layer, and a second contact structure for electrically contacting the second semiconductor layer. The first semiconductor layer is arranged between the first contact layer and the active layer. The first contact pins are arranged between the first contact layer and the first semiconductor layer and are separated and spaced apart from one another in a lateral direction. Each first contact pin forms an electrical connection with an electrical resistance between the first contact layer and the first semiconductor layer. In this case, the first contact pins are chosen such that electrical connections formed by two different first contact pins have different electrical resistances.

In this case, an optoelectronic semiconductor chip described here is based on the following considerations, inter alia. In order to achieve as homogeneous a luminous image as possible and as homogeneous a temperature distribution as possible, it is necessary to energize an optoelectronic semiconductor chip uniformly over a largest possible area. If external connection locations of the semiconductor chip are fitted at an exterior side of the semiconductor chip, then the voltage drop within current-carrying layers leads to an inhomogeneous current density distribution, however, which is manifested in an inhomogeneous luminance distribution of the semiconductor chip and/or an inhomogeneous temperature distribution within the semiconductor chip. An improved current distribution can typically be achieved by increasing the layer thickness of the current-carrying layers. However, increasing the layer thicknesses has only a global effect on the entire semiconductor chip, as a result of which a local current density increase cannot be achieved. A local change in the layer thickness would lead to the desired effect, but is technically complex. Alternatively, an adaptation of the current-carrying elements that are in direct contact with the semiconductor layer sequence can be effected in order to influence the local current density. For example, such influencing is effected by way of an adaptation of the contact structure associated with the n-conducting semiconductor layer.

The optoelectronic semiconductor chip described here makes use of the concept, inter alia, of influencing the current density locally by influencing the p-type contact structure. For this purpose, the p-type contact structure comprises a current-carrying contact layer that is in electrical contact with the semiconductor layer sequence by way of contact pins. In this case, the resistance experienced by the electric current upon flowing through the contact pins is influenced in a targeted manner in order to compensate for a voltage drop in the contact layer and to achieve as homogeneous a current density distribution in the semiconductor chip as possible.

Advantageously, a more homogeneous current density distribution leads to a more homogeneous luminous image of the semiconductor chip and to a more homogeneous temperature distribution within the semiconductor chip. Both can reduce ageing effects. An optoelectronic semiconductor chip with homogeneous luminance is desirable for example for applications with imaging optical systems. Furthermore, the optimization process or the choice of the operating point of the optoelectronic semiconductor chip is facilitated.

Furthermore, an adaptation to specific applications is alternatively possible. By way of example, a local temperature increase is desirable since the application has a heat sink at this point. A targeted local increase of the current density in the region of the heat sink makes it possible to realize an increased efficiency and stability of the optoelectronic semiconductor chip in the application.

In accordance with at least one embodiment of the optoelectronic semiconductor chip, the first contact pins are in direct contact with the first semiconductor layer in each case by way of a contact area. The surface areas of the contact areas of two different first contact pins are chosen to be different. For example, the surface area of the contact area of a first contact pin is at least 1.1 times or at least 1.2 times or at least 1.5 times the magnitude of the surface area of the contact area of another first contact pin.

The choice of the surface area of the contact areas makes it possible to influence the contact resistance of the first contact pin with respect to the first semiconductor layer. It is thus possible to influence the resistance of the electrical connection formed by the first contact pin between the first contact layer and the first semiconductor layer. By way of example, the contact areas each have the shape of a pentagon. The pentagon has for example a width of between 19 µm and 26 µm and a length of between 26 µm and 33 µm. In this case, length and width are two dimensions of the pentagon which are perpendicular to one another in a lateral plane.

For example, the surface area of a contact area is between 500 µm² and 850 µm² inclusive. Advantageously, influencing the contact area in production is particularly simple to implement, for example by means of a lift-off process or phototechnology and subsequent active patterning by means of a wet and/or dry etching process.

In accordance with at least one embodiment, lateral extents of two different first contact pins are chosen to be different. By way of example, the first contact pins have a circular or pentagonal plan in a lateral plane. In particular, the diameters of two different first contact pins are then chosen to be different. In particular, the first contact pins have an extent, referred to hereinafter as length, along a direction perpendicular to their lateral plane. The lateral extent of the first contact pins is in each case constant over their entire length for example within the scope of production tolerance. Preferably, all the first contact pins have the same length within the scope of production tolerance.

Preferably, the lateral extents of the first contact pins increase or decrease abruptly in each case at a specific length.

By way of example, the lateral extents of the first contact pins, proceeding from their side facing the first contact layer, are in each case constant as far as a specific length and then in each case rise abruptly or decrease abruptly, wherein the lateral extents after the abrupt change are constant in each case over the entire remaining length. The length at which the lateral extents change abruptly is for example in each case between 2% and 50% inclusive, preferably between 2% and 15% inclusive, of the total length of the first contact pin. Alternatively, the length at which the lateral extents change abruptly is between 50% and 98% inclusive, preferably between 80% and 98% inclusive, of the total length of the first contact pin. The lateral extents of the first contact pins in each case after the abrupt change are for example at most 10% or at most 40% or at most 80% of the lateral extent before the abrupt change. Alternatively, the lateral extents after the abrupt change are for example in each case at least 1.5 times or 2 times or 10 times the magnitude of those before the abrupt change. In particular, the lengths at which the abrupt change in the lateral extent occurs and/or the abrupt change in the lateral extent of two different first contact pins are/is chosen to be different.

Advantageously, the electrical resistance of the electrical connection between the first contact layer and the first semiconductor layer, said electrical connection being formed by the first contact pins, can be influenced particularly simply by way of a targeted choice of the lateral extent of the first contact pins.

In accordance with at least one embodiment, material compositions of two different first contact pins are chosen to be different. By way of example, the first contact pins are formed partly or completely from metal or an electrically conductive oxide. For example, the first contact pins comprise gold, silver, aluminum, palladium, platinum, titanium, nickel, an electrically conductively oxide, or consist of one of these materials or a mixture of these materials. In particular, the materials of different first contact pins are different. By way of example, two different first contact pins are formed from at least partly different materials. Alternatively, two different first contact pins are formed from the same materials, but the proportions of the different materials are different. By way of example, the first contact pins are based on gold or are formed from a gold alloy. In this case, different first contact pins differ for example in the gold content of the respective alloy.

In accordance with at least one embodiment, the first contact pins are chosen such that the resistances of the electrical connections decrease monotonically in a lateral direction. By way of example, the resistances of the first contact pins proceeding from a side surface of the semiconductor chip that interconnects the sides of the first semiconductor layer and of the second semiconductor layer facing away from the active region decrease monotonically with increasing distance from the side surface. Alternatively, the electrical resistances of the first contact pins increase monotonically proceeding from such a side surface. Preferably, all electrical connections which are formed by first contact pins which are at an identical distance from the side surface within the scope of production tolerance have the same electrical resistance. Advantageously, a voltage drop along a lateral direction can be compensated for particularly well by electrical connections with monotonically decreasing electrical resistances in this direction, as a result of which a homogeneous current distribution in the semiconductor layer sequence is achieved.

By way of example, the first contact pins are chosen such that the resistances of the electrical connections additionally decrease monotonically in a second lateral direction. In particular, the lateral direction and the second lateral direction are perpendicular to one another.

Electrical connections formed by such first contact pins which are at the smallest distance from the side surface have for example a resistance having at least 1.2 times or at least 1.5 times or at least 2 times the magnitude of the resistance of electrical connections formed by first contact pins which are at the largest possible distance from the side surface. The resistances of electrical connections formed by first contact pins which are at neither the smallest possible nor the largest possible distance from the side surface preferably decrease linearly as a function of the distance from the side surface.

In accordance with at least one embodiment, the semiconductor layer sequence has at least two disjoint regions situated next to one another in a lateral direction. A plurality of first contact pins are assigned to each of the regions. The first contact pins assigned to a common region are chosen such that the electrical connections formed by them all have the same electrical resistances (within the scope of production tolerance). First contact pins assigned to different regions are chosen such that the electrical connections realized by them have different electrical resistances. The resistances differ from one another for example by at least 10% or at least 20% or at least 50%.

By way of example, the regions are embodied in each case in connected fashion, preferably in simply connected fashion. Preferably, all regions are of the same size. In particular, an identical number of first contact pins is assigned to each region. For example, each region has at least 80 first contact pins or at least 100 first contact pins or at least 200 first contact pins. Alternatively or additionally, each region can have at most 300 or at most 400 or at most 600 first contact pins. By way of example, all these first contact pins have a contact area of identical size with respect to the first semiconductor layer and/or all have an identical lateral extent and/or all have an identical material composition. First contact pins assigned to different regions differ for example in at least one of the properties mentioned and electrical connections formed by them therefore have different resistances.

In accordance with at least one embodiment, the first contact pins each comprise an oxide layer. The oxide layer is formed from a transparent, electrically conductive oxide. The oxide layer is in each case in direct contact with the first semiconductor layer by way of a contact area. By way of example, the transparent, electrically conductively oxide comprises indium tin oxide, ITO for short, and/or further tin oxide compounds, such as tin oxide doped with fluorine or tin oxide doped with antimony. In particular, the oxide layer is transparent to the radiation emitted by the semiconductor chip. By way of example, the absorption coefficient of the material of the oxide layer for the radiation emitted by the semiconductor chip is low enough so that less than 5%, preferably less than 1%, of the emitted power is absorbed.

By way of example, the contact area of the oxide layer and of the first semiconductor layer substantially determines the contact resistance of a first contact pin. In particular, the resistance of the first contact pin can be influenced by way of the choice of the surface area of the contact area. The use of at least partly transparent first contact pins affords the advantage that the first contact pins do not have a great influence on the brightness of the optoelectronic semiconductor chip.

In accordance with at least one embodiment, the first contact pins each comprise a metal layer. In the case of each first contact pin, the metal layer is in direct contact with the oxide layer by way of an interface. The contact area and the interface are opposite sides of the oxide layer. By way of example, the metal layer comprises gold, silver, aluminum, palladium, platinum, titanium, nickel, or consists of one of these materials or a mixture of these materials. In particular, the metal layer comprises the same materials as the first contact layer. Preferably, the metal layers are in each case in direct contact with the first contact layer. With further preference, the metal layer is embodied integrally with the first contact layer. In particular, the metal layer is not in direct contact with the semiconductor layer sequence. By way of example, the resistance of a first contact pin is able to be chosen by means of the material composition of the metal layer.

In accordance with at least one embodiment, the surface areas of the interfaces of two different first contact pins are different. By way of example, if a first contact pin carries electric current, then the resistance experienced by this current is determined, inter alia, by the size of the interface between the metal layer and the oxide layer. Consequently, the resistance of the electrical connection formed by a first contact pin is advantageously able to be chosen by way of a suitable choice of the surface area of the interface of said first contact pin. For example, the surface area of the interface of one first contact pin is at least 1.1 times or at least 1.2 times or at least 1.5 times the magnitude of the surface area of the interface of another first contact pin.

Preferably, the contact areas of the first contact pins each have a surface area having at least 5 times or at least 10 times or at least 20 times the magnitude of the surface area of the associated interfaces.

In accordance with at least one embodiment, the optoelectronic semiconductor chip has an underside. The first semiconductor layer is arranged between the underside and the active layer. The optoelectronic semiconductor chip has a first and a second connection area for external electrical contacting of the semiconductor chip. The first connection area is electrically conductively connected to the first contact structure, and the second connection area is electrically conductively connected to the second contact structure. Furthermore, the first connection area and the second connection area are exposed in the non-contacted state of the semiconductor chip. By way of example, the optoelectronic semiconductor chip can be operated externally by way of the first and second connection areas. For this purpose, for example, the first and the second connection areas are contacted with a contact wire and supplied with current. In particular, the semiconductor layer sequence is thus electrically contacted by way of the electrically conductive connection of the first connection area to the first contact structure and of the second connection area to the second contact structure.

The underside is for example a side of the semiconductor chip by way of which the latter is mounted in the application. By way of example, in the application, the optoelectronic semiconductor chip is mounted in a housing and/or on a lead frame by way of the underside. Preferably, the optoelectronic semiconductor chip has a radiation side situated opposite the underside. By way of example, the optoelectronic semiconductor chip emits a large portion of its entire emitted radiation by way of the radiation side. In particular, the semiconductor chip emits more than 50% or more than 70% or more than 85% of its entire emitted radiation by way of the radiation side. By way of example, the optoelectronic semiconductor chip is a so-called thin-film chip. For example, the optoelectronic semiconductor chip finds application as a light source in a spotlight or headlight, such as for automobiles, for example. Advantageously, an optoelectronic semiconductor chip described here with a particularly homogeneous current density distribution and thus a particularly homogeneous luminance distribution forms a light source that is particularly well suited to application in a spotlight or headlight.

In accordance with at least one embodiment, the first connection area is an area of the optoelectronic semiconductor chip situated opposite the underside. The first connection area is embodied at an edge of the optoelectronic semiconductor chip. By way of example, an arrangement of the first connection area at an area of the semiconductor chip situated opposite the underside enables an external contacting of the first connection area from the direction of the radiation side. Advantageously, as a result, the optoelectronic semiconductor chip can be mounted in the application particularly simply by way of its underside since external contacting of the first connection area is effected from an opposite direction to the underside. By way of example, the second connection area is additionally likewise arranged on a side of the semiconductor chip facing away from the underside. Consequently, in this case, the first and the second connection area are contactable from a common direction. By way of example, the second connection area forms a part of the radiation side.

In particular, the edge of the optoelectronic semiconductor chip adjoins a side surface of the optoelectronic semiconductor chip. A side surface is an outer surface of the semiconductor chip which runs transversely with respect to the main plane of extent of the semiconductor layer sequence and connects the radiation side to the underside. Preferably, the first connection area adjoins said side surface.

By way of example, in a lateral direction the first contact layer has a larger extent than the semiconductor layer sequence. In particular, a side of the first contact layer facing away from the underside then forms the first connection area. In particular, that part of this side of the first contact layer which forms the first connection area is free of the semiconductor layer sequence.

In accordance with at least one embodiment, the first connection area forms at least one part of the underside of the optoelectronic semiconductor chip. By way of example, the first connection area is then electrically contacted from the direction of the underside. By way of example, the optoelectronic semiconductor chip is mounted on a lead frame in the application, such that there is an electrical connection between the lead frame and the underside of the optoelectronic semiconductor chip. By way of example, the entire underside of the optoelectronic semiconductor chip forms the first connection area.

In accordance with at least one embodiment, the second contact structure comprises a plurality of contact strips. The contact strips are arranged on a side of the second semiconductor layer facing away from the active layer and preferably run substantially parallel to one another. By way of example, the second contact structure forms a part of the radiation side of the optoelectronic semiconductor chip. In particular, the contact strips are in direct contact with the second semiconductor layer. In addition, for example, the second connection area is embodied as a part of the radiation side, thereby advantageously facilitating the electrical contacting of the second contact structure by the second connection area. By way of example, the contact strips run substantially parallel to an outer edge of the radiation side. In this case, an outer edge of the radiation side is a line of the radiation side which delimits the radiation side in a lateral direction.

By way of example, the contact strips are chosen in such a way that a particularly homogeneous current density distribution is achieved in the second semiconductor layer. For this purpose, for example, a diameter of the contact strips is chosen in a suitable way. In particular, the widths of the contact strips increase in each case along their main direction of extent, proceeding from the second connection area. In this case, a diameter is an extent of the contact strips that is measured perpendicular to a main direction of extent of the contact strips.

In accordance with at least one embodiment, the second contact structure comprises a plurality of through contacts and a second contact layer. The through contacts are in direct contact with the second semiconductor layer, and the second contact layer is arranged at a side of the first contact layer facing away from the semiconductor layer sequence. The through contacts in each case penetrate through the first contact layer, the first semiconductor layer and the active layer and are electrically insulated from them. Each through contact forms an electrical connection between the second contact layer and the second semiconductor layer. In particular, an electrical resistance is assigned to each of these electrical connections. By way of example, said electrical resistance can be influenced in a targeted manner. Features which are disclosed for influencing the resistance of the first contact pins are hereby preferably also disclosed for the influencing of the electrical resistance of the through contact, and vice versa.

By way of example, an optoelectronic semiconductor chip that comprises through contacts is a so-called via-design thin-film chip. By way of example, in the case of such an optoelectronic semiconductor chip, the first connection area and the second connection area are embodied as part of the underside. By way of example, in the application, such an optoelectronic semiconductor chip can be mounted onto a current-carrying surface and electrically contacted in a particularly simple way. In particular, a use of contact wire can be dispensed with in this case.

In accordance with at least one embodiment, the active layer and/or the first semiconductor layer and/or the second semiconductor layer are embodied in each case in simply connected fashion. In particular, such a semiconductor chip comprises no through contacts.

Further advantages and advantageous configurations and developments of the optoelectronic semiconductor chip will become apparent from the following exemplary embodiments explained in association with the figures. Elements that are identical, have identical type or act identically are provided with the same reference signs in the figures. The figures and the size relationships of the elements illustrated in the figures among one another should not be regarded as to scale. Rather individual elements may be illustrated with an exaggerated size in order to enable better illustration and/or in order to afford a better understanding.

DETAILED DESCRIPTION

Figure 1A:
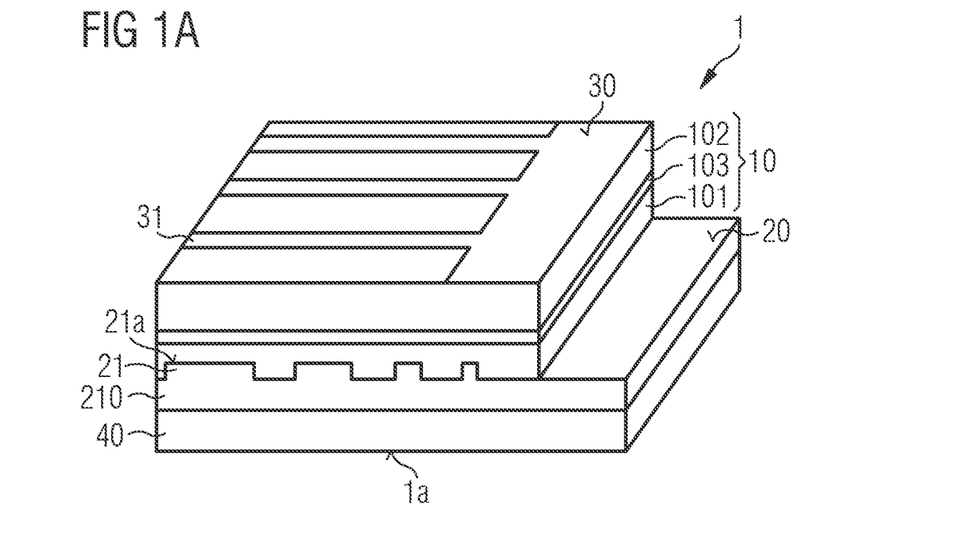
FIGS. 1A, 1B and 8 show exemplary embodiments of optoelectronic semiconductor chips in various views.

FIG. 1A illustrates in perspective view a first exemplary embodiment of an optoelectronic semiconductor chip 1 described here. The optoelectronic semiconductor chip 1 comprises a semiconductor layer sequence 10 having a first semiconductor layer 101, a second semiconductor layer 102 and an active layer 103 arranged between the first 101 and second 102 semiconductor layers. Furthermore, the optoelectronic semiconductor chip 1 comprises a first contact layer 210, wherein the first semiconductor layer 101 is arranged between the active layer 103 and the first contact layer 210.

Preferably, the first contact layer 210 comprises at least one metal or is formed from metal. For example, the first contact layer 210 is based on gold. The semiconductor layer sequence 10 is based on InGaAlP, for example. In particular, the first semiconductor layer 101 is doped with a p-type dopant and the second semiconductor layer 102 is doped with an n-type dopant. Together with first contact pins 21 the first contact layer 210 forms a first contact structure. The semiconductor layer sequence 10, in particular the first semiconductor layer 101, can be embodied in structured fashion between the first contact pins 21. By way of example, for this purpose, it is possible to remove semiconductor material between the first contact pins 21 by means of etching. The etching can be effected dry-chemically or wet-chemically, for example. The structuring, produced by the etching, of the first semiconductor layer 101 or/and the first contact pins 21 can therefore have an etching angle.

The optoelectronic semiconductor chip 1 furthermore comprises an underside 1*a*. In this case, the underside 1*a* is formed by a side of a carrier 40 that faces away from the first contact pin 210. Preferably, the carrier 40 is distinguished by a coefficient of thermal expansion adapted to the first contact pin 210 and/or the semiconductor layer sequence 10, such that stresses that possibly occur in the event of heating of the optoelectronic semiconductor chip 1 during operation are avoided. By way of example, the carrier 40 can comprise a semiconductor material such as germanium, gallium arsenide, gallium nitride, silicon, and/or other materials, such as sapphire, silicon nitride, aluminum nitride, and metals. Furthermore, the carrier 40 has in particular a high thermal conductivity in order that heat that arises during operation as intended can be dissipated to the surroundings at least in part by way of the carrier 40.

Preferably, the carrier 40 comprises a mirror layer. The mirror layer comprises for example a Bragg mirror, a dielectric mirror or a metal-containing mirror layer. With further preference, that side of the carrier 40 which faces the semiconductor layer sequence 10 is embodied as a mirror. For example, this side of the carrier 40 is formed from a material, such as a metal or a metal alloy, which at least partly reflects the radiation generated in the active layer 103. By way of example, the side of the carrier 40 facing the semiconductor layer sequence 10 reflects at least 80% or at least 90% or at least 95% of the radiation generated in the active layer 103. Advantageously, it is possible to reduce light losses as a result of a reflectively coated carrier 40.

The optoelectronic semiconductor chip 1 additionally comprises a first connection area 20. The first connection area 20 is arranged at a side of the optoelectronic semiconductor chip 1 facing away from the underside 1*a*, and in the present case is arranged at a side of the first contact layer 210 facing away from the underside 1*a*. A second contact structure of the optoelectronic semiconductor chip 1 comprises contact webs 31. The contact webs 31 are electrically conductively connected to a second connection area 30, which in the present case is arranged at a side of the second semiconductor layer 102 facing away from the active layer 103. The contact webs 31 are situated in particular in direct contact with the second semiconductor layer 102.

The first contact pins 21 are in direct contact with the first semiconductor layer 101 by way of contact areas 21*a*. In the present exemplary embodiment, the semiconductor chip 1 is not contacted externally, as a result of which the first connection area 20 and the second connection area 30 are exposed. During operation as intended, the optoelectronic semiconductor chip 1 is contacted externally by means of a contact wire, for example. During operation, the first contact structure and the second contact structure are then energized by way of the first 20 and second 30 connection areas. The semiconductor layer sequence 10 is energized by means of the contact webs 31 and the first contact pins 21. Preferably, the contact webs 31 are arranged in a manner not overlapping the first contact pins 21, as viewed in the vertical direction.

The first contact pins 21 in each case form an electrical connection between the first contact layer 210 and the first semiconductor layer 101. These electrical connections each have an electrical resistance. In the present exemplary embodiment, different contact areas 21*a* have different surface areas and different lateral extents. As a result of the first contact pins 21 having contact areas 21*a* and lateral extents of different magnitudes, different electrical connections formed in each case by different first contact pins 21 have resistances of different magnitudes. In the present case, the contact areas 21*a* at a larger distance from the first connection area 20 have a larger surface area than such contact areas 21*a* which are at a smaller distance from the connection area 20. Accordingly, the electrical connections that are at a larger distance from the connection area 20 thus have a lower resistance. Advantageously, it is thus possible to compensate for a voltage drop within the first contact layer 210 and the first semiconductor layer 101 can be energized with a homogeneous current density distribution.

Figure 1B:
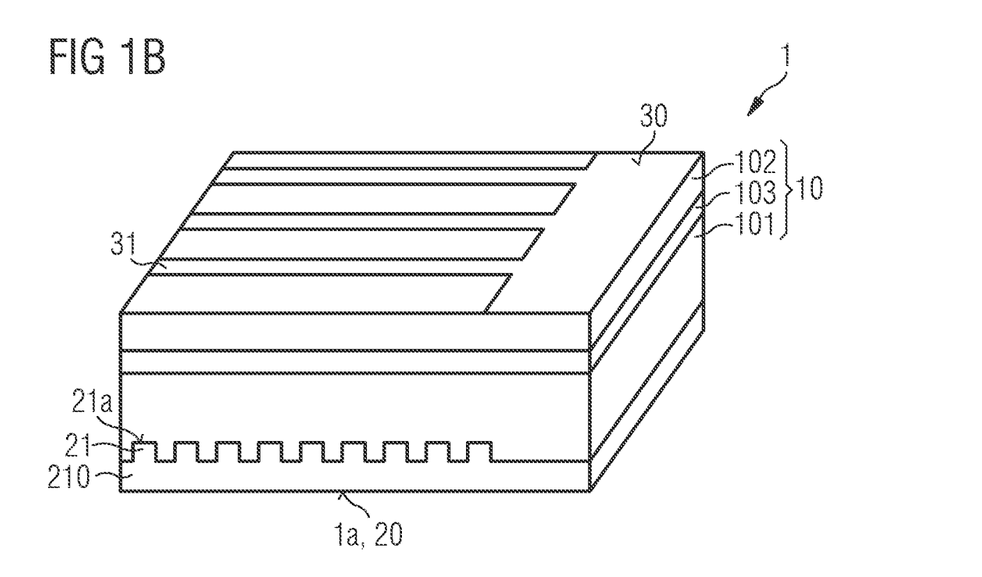

FIG. 1B illustrates a second exemplary embodiment of the optoelectronic semiconductor chip 1 in perspective view. FIG. 1B substantially shows the same features as FIG. 1A with the difference that the contact layer 210 has the same lateral extent as the semiconductor layer sequence 10. Furthermore, a side of the first contact layer 210 facing away from the semiconductor layer sequence 10 forms the underside 1*a* of the optoelectronic semiconductor chip 1. The first connection area 20 is fitted at the underside 1*a* of the optoelectronic semiconductor chip 1. A further difference with respect to the first exemplary embodiment of the optoelectronic semiconductor chip is that the contact areas 21*a* all have the same surface area. By way of example, the intrinsic resistances of the first contact pins 21 then have different values. The electrical connections formed by the first contact pins 21 thus also have in each case different values for the electrical resistance. In particular, for example, the material composition of different first contact pins 21 is chosen in such a way that different electrical connections have different resistances.

Figure 2:
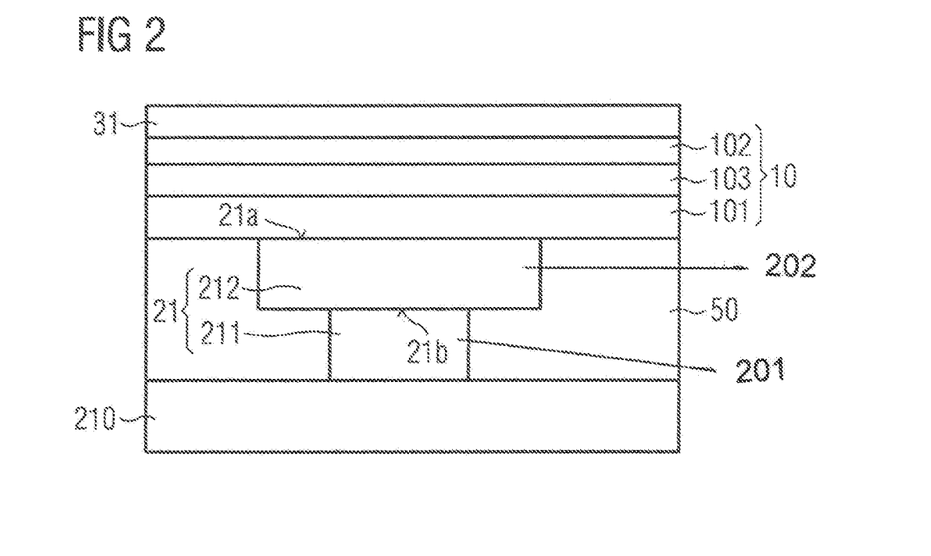
FIG. 2 shows an exemplary embodiment of a first contact pin in detail in a schematic sectional view.

FIG. 2 illustrates a first contact pin 21 in accordance with a first exemplary embodiment in detail in a schematic sectional view. The first contact pin 21 comprises a metal layer 211 and an oxide layer 212, formed from a transparent, electrically conductive oxide. The oxide layer 212 is in direct contact with the first semiconductor layer 101 by way of a contact area 21*a* and is in direct contact with the metal layer 211 by way of an interface 21*b*. The metal layer 211 is in direct contact with the first contact layer 210. Regions between the first semiconductor layer 101 and the first contact layer 210 which are not filled by the first contact pin 21 are filled by an electrically insulating material 50, such as silicon dioxide or silicon nitride, for example. Alternatively, the electrically insulating material can also be air or a gas. Consequently, the first contact pin 21 comprises a first region 201 and a second region 202, wherein the first region 201 of the first contact pin 21 is formed by a section of the metal layer 211 and the second region 202 of the first contact pin 21 is formed by a section of the oxide layer 212 that adjoins said section of the metal layer 211. An analogous statement holds true for each first contact pin 21. That is to say that each first contact pin 21 comprises a first region 201 and a second region. The second region 202 of each first contact pin 21 advantageously has a larger lateral extent than its first region 201, in order to enable better current spreading. In particular, the oxide layer 212 or the sections of the oxide layer 212 of the first contact pins 21 can be embodied in each case for current spreading.

The first contact pin 21 forms an electrical connection between the first semiconductor layer 101 and the first contact layer 210. The electrical connection has a resistance. The resistance is determined by the size of the contact area 21*a*, the size of the interface 21*b*, the material composition of the oxide layer 212, the material composition of the metal layer 211 and also the lateral and vertical extents of the oxide layer 212 and of the metal layer 211. The electrical resistance can be predefined by adaptation of one of these properties of the first contact pin 21. Advantageously, a construction of a first contact pin 21 as described here affords particularly many possibilities for adapting the electrical resistance of an electrical connection formed by the first contact pin 21. Consequently, it is advantageously possible to choose a particularly large range of values for the resistance.

Figure 3:
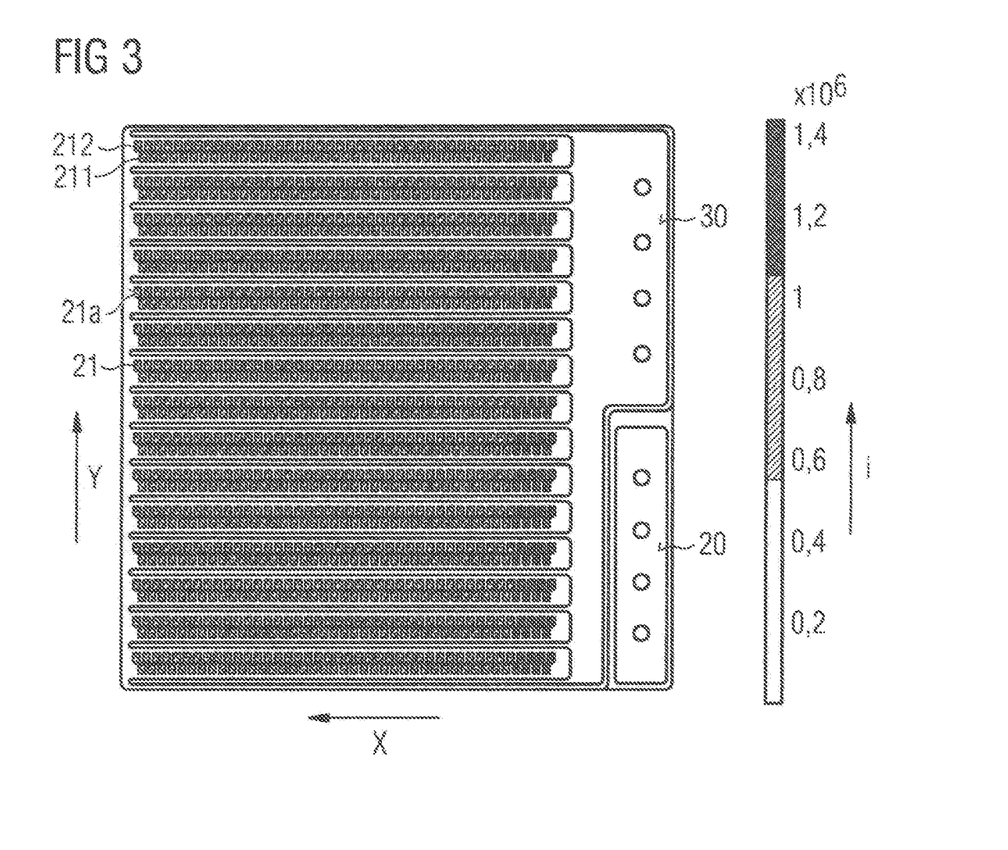
FIG. 3 shows a modification of a semiconductor chip in plan view.

FIG. 3 shows a modification of a semiconductor chip with a current density distribution schematically in a plan view of a side facing away from an underside 1a of the semiconductor chip 1. By way of example, an extent of the semiconductor chip is between 500 µm and 3000 µm inclusive in the X-direction and between 500 µm and 3000 µm inclusive in the Y-direction. In particular, the extent of the semiconductor chip is between 1000 µm and 2000 µm inclusive in each case in the X-direction and in the Y-direction.

First contact pins 21 of the modification each have a contact area 21a. The first contact pins 21 are all formed identically here within the scope of production tolerances. The first contact pins 21 are arranged in strips. This is taken to mean that the first contact pins 21 are not distributed uniformly over the side shown in plan view. Rather, a density of first contact pins 21 is greater in the region of strip-shaped sections than outside these sections. The sections substantially all have the same size and run parallel to one another. The contact areas 21a of the first contact pins 21 are each embodied as a pentagon in the present case.

Furthermore, the optoelectronic semiconductor chip 1 has a first connection area 20 and a second connection area 30, which are arranged at the edge of the optoelectronic semiconductor chip 1. The first 20 and second 30 connection areas are arranged at a side of the semiconductor chip 1 facing away from the underside 1a and are contactable from a common direction.

In the case of the present modification, a current density i measured in A/m² has the highest value of 1.4 MA/m² in regions of the semiconductor chip at which the first contact pins 21 are at a small distance from the first connection area 20 in direction X. With increasing distance from the connection area 20 in the X-direction, the current density i decreases, to a minimum value of approximately 0.6 MA/m². The decrease in the current density is caused by the voltage drop along the first contact layer and by virtue of all the contact pins having a construction of identical type.

Figure 4A:
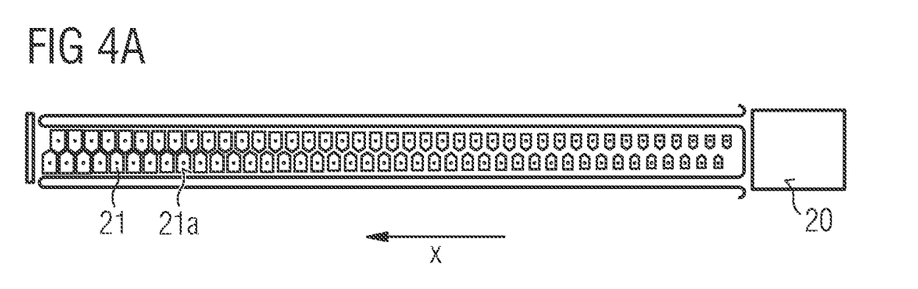
FIGS. 4A, 4B, 4C, 6A, and 6B show detail views of contact pins from exemplary embodiments of semiconductor chips.

FIG. 4A shows a strip of first contact pins 21 from one exemplary embodiment of the semiconductor chip. Such a strip is used in the exemplary embodiment in FIG. 1, for example. The surface areas of the contact areas 21a increase in the X-direction. Consequently, the electrical connections formed by the first contact pins 21 that are at a large distance from the first connection area 20 in the X-direction have a lower resistance than electrical connections formed by such first contact pins 21 which are at a small distance from the first connection area 20 in the X-direction. This choice of the first contact pins 21 enables the distribution of the current density i to be influenced in a targeted manner and homogenized in comparison with FIG. 3. The luminance can thus be homogenized as well.

Figure 4B:
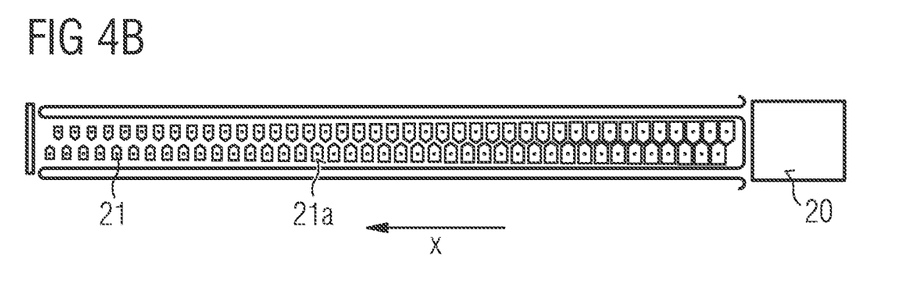

FIG. 4B shows a strip of first contact pins 21 from a further exemplary embodiment of a semiconductor chip. FIG. 4B shows substantially the same features as FIG. 4A with the difference that the surface areas of the contact areas 21a decrease with increasing distance from the first connection area 20 in the X-direction. This choice of the first contact pins 21 results in an increase in the current density i in regions of the optoelectronic semiconductor chip 1 at a small distance from the first connection area 20 since, in these regions, the resistances of the electrical connections formed by the first contact pins 21 are reduced by comparison with regions at a larger distance. Such a local increase in the current density i leads in particular to a local increase in the luminance and/or temperature during operation of the semiconductor chip 1. This affords an advantage in the application if for example a specific imaging optical system is disposed downstream of the regions of increased luminance in an emission direction.

Figure 4C:
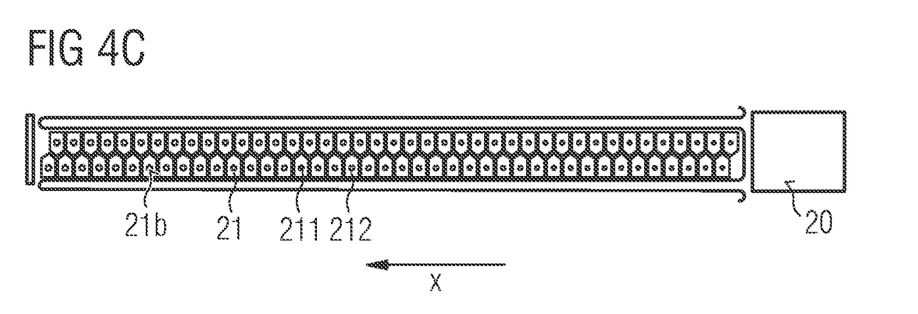

FIG. 4C shows a strip of first contact pins 21 from a further exemplary embodiment of the semiconductor chip. FIG. 4C substantially shows the same features as FIG. 4A with the difference that the surface areas of the contact areas 21a are all identical within the scope of production tolerance, but in return surfaces areas of the interface 21b between the oxide layer 212 and the metal layer 211 increase monotonically along the X-direction. The increase has the effect that the resistances of the electrical connections formed by the first contact pins 21 decrease in the X-direction. Qualitatively the same effect as the choice of the surface areas of the contact areas 21a as described in FIG. 4A thus results.

Figure 4D:
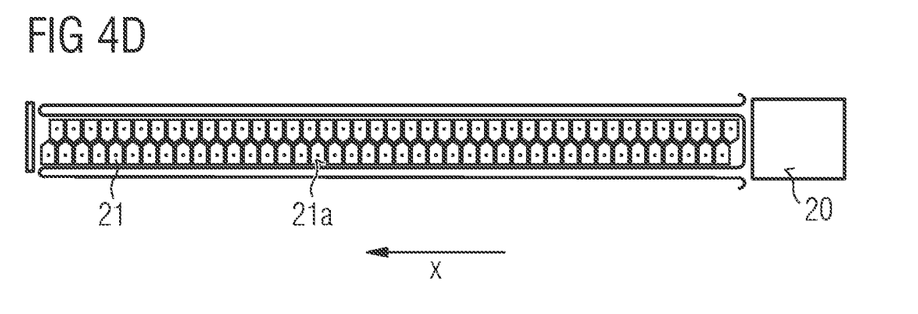
FIG. 4D shows a detail view of contact pins from a modification of a semiconductor chip.

FIG. 4D shows a strip of first contact pins 21 from the modification of the semiconductor chip in accordance with FIG. 3. In the present case, the contact areas 21a, in contrast to the contact pins 21A in FIG. 4A, all have the same surface area. Furthermore, all the first contact pins 21 each have the same lateral extent. In particular, electrical connections formed by these first contact pins 21 all have the same electrical resistance within the scope of production tolerance.

Figure 5:
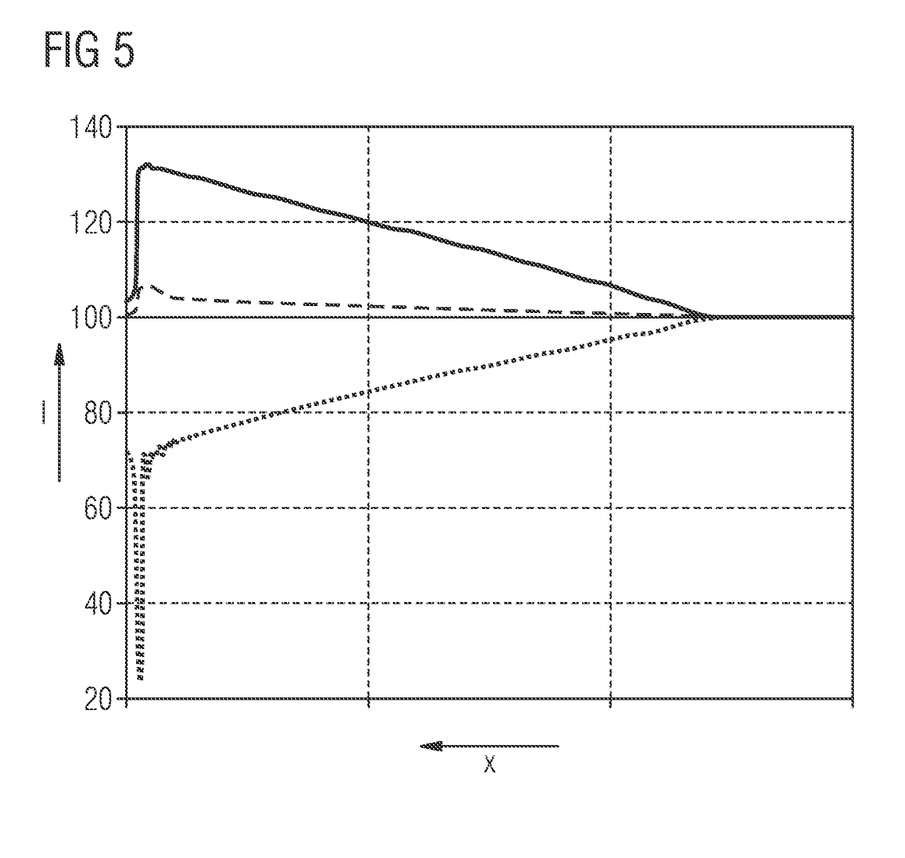
FIG. 5 shows a graph of a cumulated current density for first contact pins embodied in various ways.

FIG. 5 shows the relative cumulated current density I for four situations. The four situations correspond to the exemplary embodiments in FIGS. 4A to 4C and the modification in accordance with FIG. 4D, the solid line describing the exemplary embodiment in accordance with FIG. 4A, the dotted line describing the exemplary embodiment in accordance with FIG. 4B, the dashed line describing the exemplary embodiment in accordance with FIG. 4C and the thin line serving as a reference in accordance with FIG. 4D. The current density i is integrated along the X-direction and presented as a cumulated current density I in the present figure. The curve thus describes for each distance in the X-direction the value of the current density integrated as far as this aforesaid distance. In this case, all the curves are normalized to the reference, wherein the reference corresponds to the modification of the optoelectronic semiconductor chip in accordance with FIG. 3, in which electrical connections formed by first contact pins 21 all have the same electrical resistance.

The graph in accordance with the exemplary embodiment from FIG. 4A shows that the relative cumulated current density I increases in relation to the reference in the X-direction. Consequently, by way of first contact pins 21 that are at a large distance from the first connection area 20 in the X-direction, relative to the reference more current flows into the semiconductor layer sequence 10. As a result, it is possible to compensate for a voltage drop in the first contact layer 210 along the X-direction and to achieve a more homogeneous luminance distribution. The same applies to the graph in accordance with the exemplary embodiment from FIG. 4C, that is to say the dashed line. The opposite is the case for the exemplary embodiment in accordance with FIG. 4B, in which the cumulated current density I decreases in relation to the reference with increasing distance from the first connection area 20 in the X-direction.

Figure 6A:
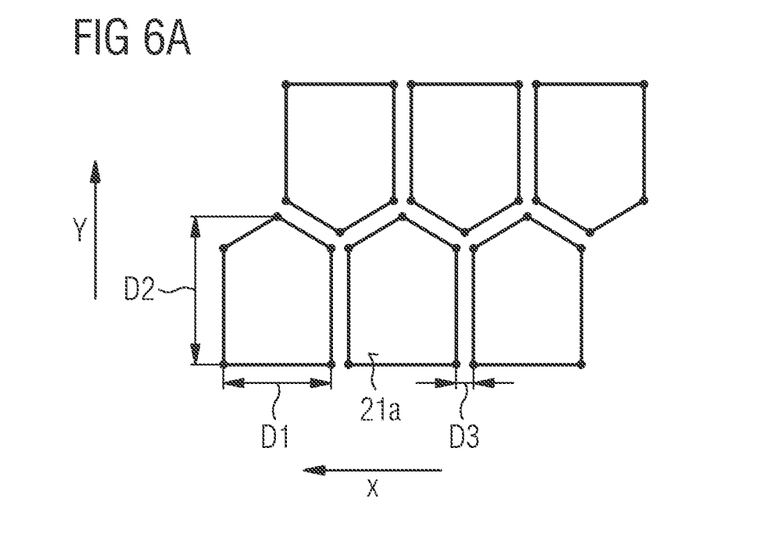

FIG. 6A shows first contact pins 21 in a plan view of contact areas 21a in a detail view. The contact areas 21a each have a pentagonal shape. A width D1 of a pentagon, measured parallel to the X-direction, is for example between 19 μm and 26 μm inclusive. A length D2 of a pentagon, measured parallel to the Y-direction, is for example between 26 μm and 33 μm inclusive. A distance D3 between two pentagons, measured in the X-direction, is for example between 2 μm and 8 μm inclusive.

Figure 6B:
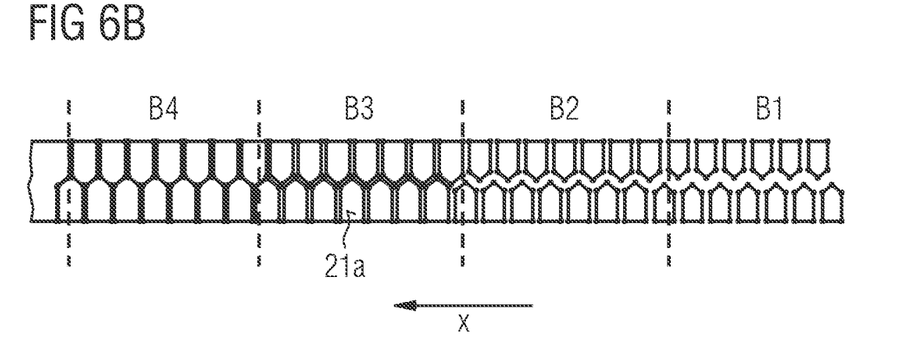

FIG. 6B shows a strip of first contact pins 21 in a detail view. In this case, FIG. 6B shows substantially the same features as FIG. 4A with the difference that the contact areas 21a increase in sections. The first contact pins 21 are assigned to four regions B1 to B4. Within each region B1 to B4, the contact areas 21a have substantially the same surface area and identical distances among one another. In particular, electrical connections formed by first contact pins 21 assigned to a common region B1 to B4 have in each case the same electrical resistance within the scope of production tolerance. Contact areas 21a of different regions each have a different surface area and the electrical connections formed by the associated first contact pins 21 thus each have a different resistance. The surface areas of the contact areas 21a increase in sections in the X-direction. By way of example, the value of the width D1 of the contact area, measured over the entire extent parallel to the X-direction, rises by 8 nm per μm. At the same time, for example, the value of the length D2 rises by 8.5 nm per μm and the distance D3 decreases by 8 nm per μm. The entire extent parallel to the X-direction is between 700 μm and 1200 μm inclusive for example.

Figure 7:
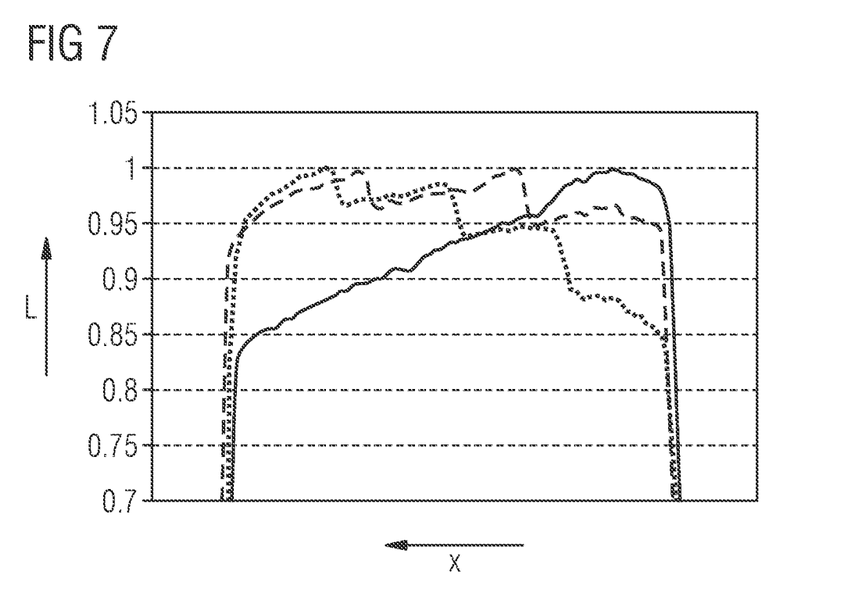
FIG. 7 shows a graph of a luminance for first contact pins embodied in various ways.

FIG. 7 shows a graph of the relative integrated luminance L of optoelectronic semiconductor chips 1 in accordance with two exemplary embodiments and a reference. The reference is substantially a modification of the semiconductor chip in which electrical connections formed by first contact pins 21 all have the same electrical resistance. The exemplary embodiments are substantially the exemplary embodiments in accordance with FIG. 6B, in which the contact areas 21a of the first contact pins 21 increase in sections. In particular, an X-direction extends in each case proceeding from the first connection areas 20. The curves describe the luminance L integrated in the Y-direction for each distance from the first connection area 20 in the X-direction. All the curves shown are normalized in each case to their maximum value. To put it another way, the graph shows the normalized luminance L as a function of the distance from the first connection areas 20 in the X-direction.

The solid line shows the reference. The luminance L decreases continuously with increasing distance from the connection area 20 in the X-direction. At the outer edge of the optoelectronic semiconductor chip situated opposite the connection area, the luminance L is less than 85% of the luminance L in direct proximity to the connection area.

The dashed line shows the luminance of an exemplary embodiment of an optoelectronic semiconductor chip 1 in which the semiconductor layer sequence 10 has three disjoint regions B1 to B3. The three regions preferably all have the same lateral extent. In particular, electrical connections formed by first contact pins 21 assigned to a common region all have the same electrical resistance in each case, within the scope of production tolerance. By contrast, electrical connections resulting from first contact pins 21 assigned to different regions each have a different resistance. For example, the resistances differ by 5% or by 10% or by 20%. It is clearly discernible in FIG. 7 that a homogenization of the luminance L is attained by the regional adaptation of the electrical resistances. The luminance L for each distance between the first contact pins 21 and the first connection area 20 is at least 90% of the maximum luminance.

The dotted line substantially relates to an optoelectronic semiconductor chip 1 such as forms the basis for the dotted line, with the difference that the semiconductor layer sequence 10 is subdivided into four disjoint regions B1 to B4. In the present case, a homogenization of the integrated luminance L can likewise be achieved. In this case, the value does not form the value of 80% of the maximum luminance L at any time. In particular, it is possible to counteract the effect of the decreasing luminance L with decreasing distance from the connection area 20 in the X-direction.

Figure 8:
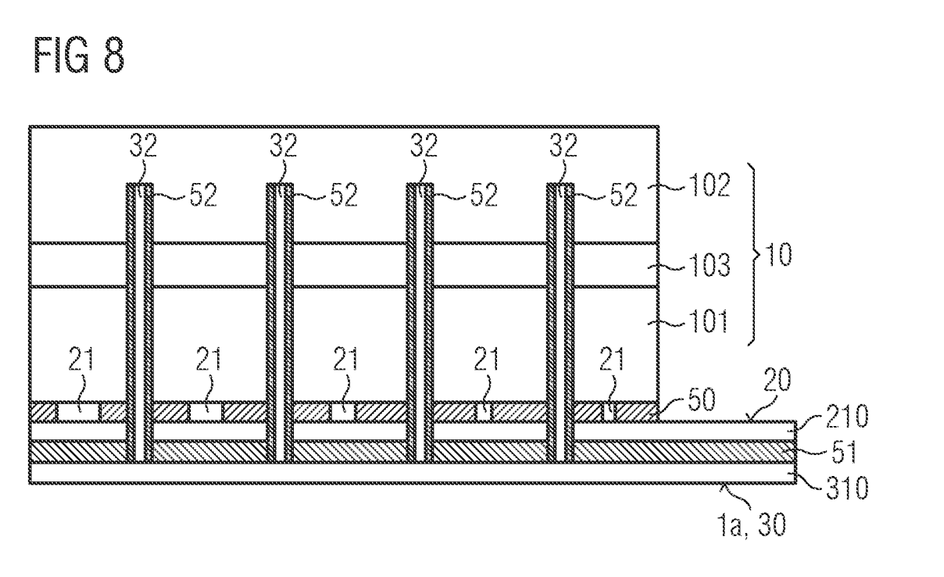

FIG. 8 shows an optoelectronic semiconductor chip 1 in accordance with a further exemplary embodiment. In this case, the present optoelectronic semiconductor chip 1 exhibits substantially the same features as the semiconductor chip in accordance with FIG. 1 with the difference that the second contact structure comprises through contacts 32 and a second contact layer 310. Furthermore, the second connection area 30 is arranged at the underside 1a of the optoelectronic semiconductor chip. In the present case, the underside 1a is formed by a side of the second contact layer 310 facing away from the semiconductor layer sequence 10. A layer of electrically insulating material 51 is arranged between the first contact layer 210 and the second contact layer 310. The electrically insulating material 51 comprises silicon dioxide and/or silicon nitride and/or aluminum oxide, for example. The through contacts 32 completely penetrate through the layer of insulating material 51, the first contact layer 210, the first semiconductor layer 101 and the active layer 103. Furthermore, the through contacts 32 are electrically insulated from the first contact layer 210, the first semiconductor layer 101 and the active layer 103 by means of an electrically insulating material 52. In this case, the electrically insulating material 52 comprises for example the same materials as the electrically insulating material 51. In particular, the electrically insulating material 52 is formed from the same material as the electrically insulating material 51.

The invention is not restricted to the exemplary embodiments of the description on the basis of said exemplary embodiments. Rather, the invention encompasses any novel feature and also any combination of features, which in particular includes the combination of features in the patent claims, even if this feature or this combination itself is not explicitly specified in the patent claims or exemplary embodiments.

The invention claimed is:

1. An optoelectronic semiconductor chip comprising
   a semiconductor layer sequence having a first semiconductor layer, a second semiconductor layer and an active layer between the first and the second semiconductor layers,
   a first contact structure having a plurality of first contact pins and a first contact layer for electrically contacting the first semiconductor layer, and
   a second contact structure for electrically contacting the second semiconductor layer, wherein
   the first semiconductor layer is arranged between the first contact layer and the active layer,
   the plurality of first contact pins are arranged between the first semiconductor layer and the first contact layer, the plurality of first contact pins are arranged in a manner separated and spaced apart from one another in a lateral direction, each of the plurality of first contact pins forms an electrical connection with an electrical resistance between the first contact layer and the first semiconductor layer, the plurality of first contact pins are chosen such that electrical connections formed by two different first contact pins have different electrical resistances, and each of the plurality of first contact pins comprises a first region adjoining a second region, wherein the second region has a larger lateral extent than the first region.

2. The optoelectronic semiconductor chip as claimed in claim 1, wherein the plurality of first contact pins are in direct contact with the first semiconductor layer by way of a plurality of contact areas, the surface areas of the plurality of contact areas of the two different first contact pins of the plurality of first contact pins are chosen to be different.

3. The optoelectronic semiconductor chip as claimed in claim 1, wherein lateral extents of the two different first contact pins of the plurality of first contact pins are chosen to be different.

4. The optoelectronic semiconductor chip as claimed in claim 1, wherein material compositions of the two different first contact pins of the plurality of first contact pins are chosen to be different.

5. The optoelectronic semiconductor chip as claimed in claim 1, wherein the first contact pins are chosen such that the electrical resistances of the electrical connections decrease monotonically in a lateral direction.

6. The optoelectronic semiconductor chip as claimed in claim 1, wherein the semiconductor layer sequence has at least two disjoint regions situated next to one another in a lateral direction, one or more first contact pins of the plurality of first contact pins are assigned to each of the disjoint regions, the one or more first contact pins of the plurality of first contact pins assigned to a common disjoint region are chosen such that the electrical connections realized by them all have the same electrical resistances, the one or more first contact pins of the plurality of first contact pins assigned to a different disjoint region are chosen such that the electrical connections realized by them have different electrical resistances.

7. The optoelectronic semiconductor chip as claimed in claim 1, wherein the first contact pins of the plurality of first contact pins each comprise an oxide layer, formed from a transparent, electrically conductive oxide, and the oxide layers are in direct contact with the first semiconductor layer by way of a contact area.

8. The optoelectronic semiconductor chip as claimed in claim 7, wherein the first contact pins of the plurality of first contact pins each comprise a metal layer, each of the first contact pins of the plurality of first contact pins the metal layer is in direct contact with the oxide layer by way of an interface, the contact area and the interface are opposite sides of the oxide layer.

9. The optoelectronic semiconductor chip as claimed in claim 8, wherein the surface area of the interface of the two different first contact pins of the plurality of first contact pins are different.

10. The optoelectronic semiconductor chip as claimed in claim 1, wherein the optoelectronic semiconductor chip has an underside, the first semiconductor layer is arranged between the underside and the active layer, the optoelectronic semiconductor chip comprises a first and a second connection area for external electrical contacting of the semiconductor chip, the first connection area is electrically conductively connected to the first contact structure, the second connection area is electrically conductively connected to the second contact structure, the first connection area and the second connection area are exposed in the non-contacted state of the semiconductor chip.

11. The optoelectronic semiconductor chip as claimed in claim 10, wherein the first connection area forms an area of the optoelectronic semiconductor chip that is situated opposite the underside, and the first connection area is embodied at an edge of the optoelectronic semiconductor chip.

12. The optoelectronic semiconductor chip as claimed in claim 10, wherein the first connection area forms at least one part of the underside of the optoelectronic semiconductor chip.

13. The optoelectronic semiconductor chip as claimed in claim 1, wherein the second contact structure comprises a plurality of contact strips, the contact strips are arranged on a side of the second semiconductor layer facing away from the active layer and run substantially parallel to one another.

14. The optoelectronic semiconductor chip as claimed in claim 13, wherein the second contact structure comprises a plurality of through contacts and a second contact layer, the plurality of through contacts are in direct contact with the second semiconductor layer, the second contact layer is arranged at a side of the first contact layer facing away from the semiconductor layer sequence, the plurality of through contacts penetrate through the first contact layer, the first semiconductor layer and the active layer and are electrically insulated from them, and each of the plurality of through contact forms an electrical connection between the second contact layer and the second semiconductor layer.

15. The optoelectronic semiconductor chip as claimed in claim 1, wherein the active layer and/or the first semiconductor layer and/or the second semiconductor layer are embodied in simply connected fashion.

* * * * *